United States Patent [19]

Sutrina et al.

[11] Patent Number: 4,613,892

[45] Date of Patent: Sep. 23, 1986

[54] LAMINATED SEMICONDUCTOR ASSEMBLY

[75] Inventors: Thomas Sutrina; John Readman, both of Rockford, Ill.

[73] Assignee: Sundstrand Corporation, Rockford, Ill.

[21] Appl. No.: 703,102

[22] Filed: Feb. 19, 1985

[51] Int. Cl.⁴ .............................................. H01L 23/16
[52] U.S. Cl. ........................................ 357/75; 357/74; 357/76; 357/81
[58] Field of Search ........................ 357/74, 75, 76, 79, 357/70, 71, 81; 361/386, 387, 388; 174/52 R, 52 FP

[56] References Cited

U.S. PATENT DOCUMENTS

| | | | |
|---|---|---|---|
| 3,105,922 | 10/1963 | Fukui et al. | 357/75 |
| 3,187,210 | 6/1965 | Ost | 357/75 |
| 3,225,260 | 12/1965 | Borchier et al. | 357/75 |
| 3,266,125 | 8/1966 | Tobolski | 357/75 |
| 3,398,327 | 8/1968 | Ferris | 174/72 B |
| 3,400,303 | 9/1968 | Rowlands et al. | 174/72 B |
| 3,411,041 | 11/1968 | Block | 361/386 |
| 3,419,763 | 12/1968 | Beaudouin | 357/75 |
| 3,548,121 | 12/1970 | Suenaga et al. | 357/75 |
| 3,551,758 | 12/1970 | Ferree | 357/75 |
| 3,649,881 | 3/1972 | Chang et al. | 357/75 |
| 3,705,332 | 12/1972 | Parks | 357/75 |
| 3,719,860 | 3/1973 | Lawrence | 174/52 FP |
| 3,886,654 | 6/1975 | Erdle | 174/72 B |
| 3,936,704 | 2/1976 | Brenneman et al. | 361/383 |
| 3,961,129 | 6/1976 | Gehrs et al. | 174/72 B |
| 4,184,199 | 1/1980 | Bardahl et al. | 361/382 |
| 4,454,602 | 6/1984 | Smith | 372/36 |
| 4,547,834 | 10/1985 | Dumont et al. | 361/386 |

*Primary Examiner*—James W. Davie
*Assistant Examiner*—Georgia Y. Epps
*Attorney, Agent, or Firm*—Wood, Dalton, Phillips Mason & Rowe

[57] ABSTRACT

The problem of compensating for dimensional differences occuring in the length of adjacent stacks of semiconductors or other electronic components in an electrical assembly of such components is avoided through the use of a plurality of housing sections one for each stack with each housing section being comprised of stacked thin sheets of electrically conductive or electrically insulating material. Some of the sheets have cutouts to receive semiconductors. The stacks are tied together by ribbon-like flexible tabs integral with at least some of the sheets and interconnecting the housing sections. The tabs are constructed to be deformable generally independently of the other of the tabs.

10 Claims, 4 Drawing Figures

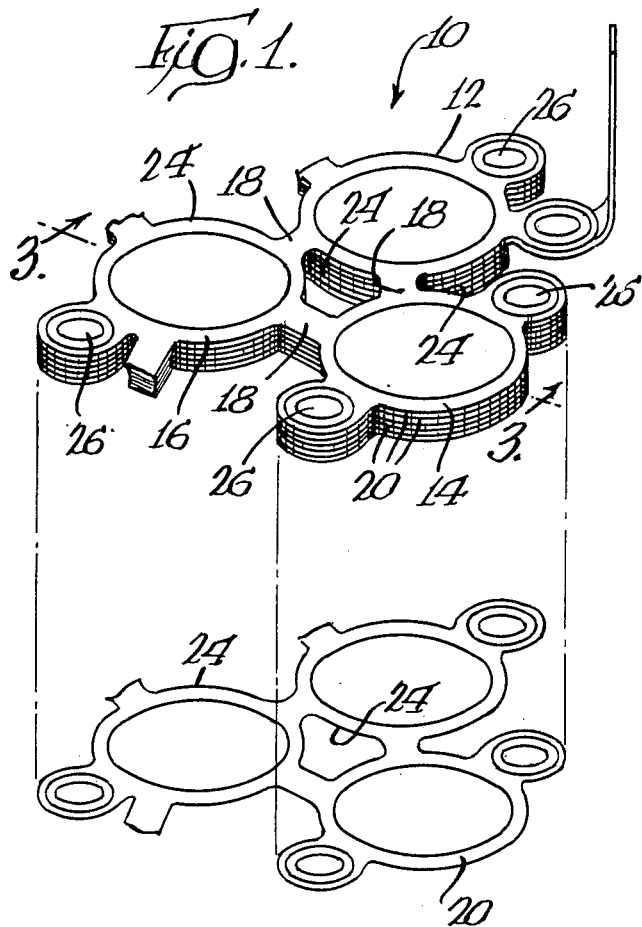
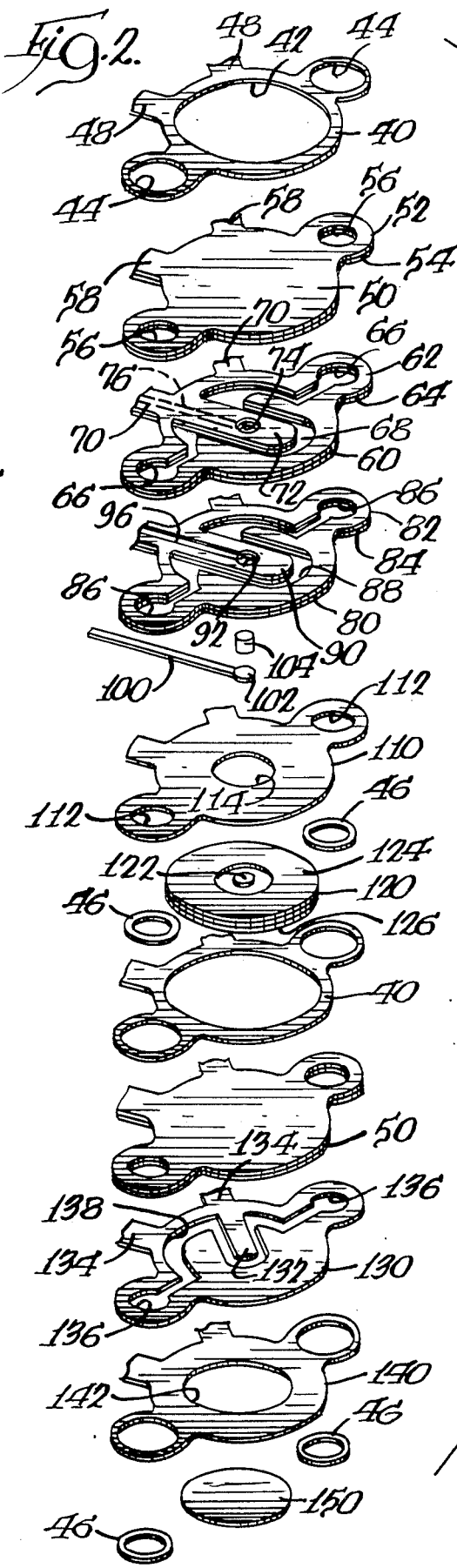

LAMINATED SEMICONDUCTOR ASSEMBLY

FIELD OF THE INVENTION

This invention relates to an assembly of semiconductors, and specifically, to an assembly of plural stacks of semiconductors including a housing for the stacks formed of multiple layers or laminations.

BACKGROUND OF THE INVENTION

In the packaging of electronics, there are a number of basic problems. The problems include the reduction of the parts count, simplifying the assembly, the incorporation of multiple functions into fewer components, and providing a compact assembly. These problems are most evident when assembling power electronics because of the higher energy momentum inherent in such systems.

One approach to the problem is to create subassemblies which integrate multiple functions into a very few components. The electronic components are suitable affixed to the sub-assembly as, for example, to a printed circuit board. The printed circuit thus provides multiple electrical interconnections between the components. However, this approach is limited to medium level currents and is not useable for power electronics.

Another approach is to create special housings and/or assemblies utilizing what may be called unpackaged, semiconductors, i.e., semiconductor wafers not provided with their customary individual housings or terminals. Because the electronic components are included in the assembly in a form stripped of their conventional packaging, the assembly can be simplified and will be more compact. Parts count is likewise reduced. Illustrative of this approach are U.S. Pat. No. 3,551,758 issued Dec. 29, 1970 to Ferree and U.S. Pat. No. 3,649,881 issued Mar. 14, 1972 to Chang et al.

In following this approach, other problems may manifest themselves. For example, components including semiconductor wafers, like all components of virtually any system, are subject to tolerance variations. Furthermore, when components of different types are employed at roughly corresponding locations in the assembly, the differing components most frequently will have differing dimensions.

In order to be suitable, the assembly must be such as to accommodate such dimensional differences, whether due to tolerances or due to dissimilarity of components.

The above-identified patents illustrate means by which such can be achieved but the approaches therein taken are not readily implemented in relatively large size units or on a rapid production basis.

The present invention is directed to overcoming one or more of the above problems.

SUMMARY OF THE INVENTION

It is a principal object of the invention to provide a new and improved electrical assembly of semiconductors and other electronic components. More specifically, it is an an object of the invention to provide a new and improved assembly that readily compensates for dimensional differences in stacks of electronic components.

According to the invention, there is provided an electrical assembly of semiconductor or other electronic components comprising at least two stacks of semiconductor wafers in spaced, parallel relation. A plurality of housing sections are provided, one for each stack and each is comprised of stacked thin sheets of electrically conductive or electrically insulating material in predetermined relation to each other. At least some of the sheets have cutouts shaped to receive a predetermined one of the semiconductor wafers in the associated stack or another electronic component. Means are provided for holding the sheets together such that each such housing section houses the semiconductors of the associated stack. Ribbon-like flexible tabs integral with at least some of the sheets are provided to interconnect the housing sections and advantageously may be employed as bus bars electrically interconnecting desired points in adjacent ones of the stacks to avoid the need for fabricated connections as brazed or soldered connections. The tabs are deformable generally independently of the others of the tabs to accommodate dimensional differences between the stacks along the length thereof.

Because of the use of thin sheets or layers with tabs that may individually deform at locations between the housing sections, dimensional differences are tolerated. According to one embodiment of the invention, the layers or sheets may be bonded to each other about the cutouts which receive the semiconductors and are unbonded in the areas between the stacks which are defined by the tabs.

In a highly preferred embodiment, the layers in each housing section have aligned openings defining at least one coolant manifold radially outwardly of the cutouts receiving the semiconductors and some of the layers or sheets have a cooling path cut out extending to the opening in the corresponding layer. Preferably, the cooling path cutouts are tortuous in configuration.

The layers may comprise laminated sheets of dissimilar or similar ones of the materials utilized.

In a highly preferred embodiment, the length of the tabs is slightly greater than the desired spacing between the housing sections. This allows the tabs to be deformed in compression rather than tension to provide better uniformity of construction and to assure that where the tabs form part of an electrically conductive path, such path will not be unduly narrowed or broken as a result of stretching under tension.

Other objects and advantages will become apparent from the following specification taken in connection with the accompanying drawings.

DESCRIPTION OF THE DRAWINGS

FIG. 1 is a perspective view of an assembly made according to the invention;

FIG. 2 is an exploded view of one part of the assembly;

DESCRIPTION OF THE PREFERRED EMBODIMENT

Figure 3:
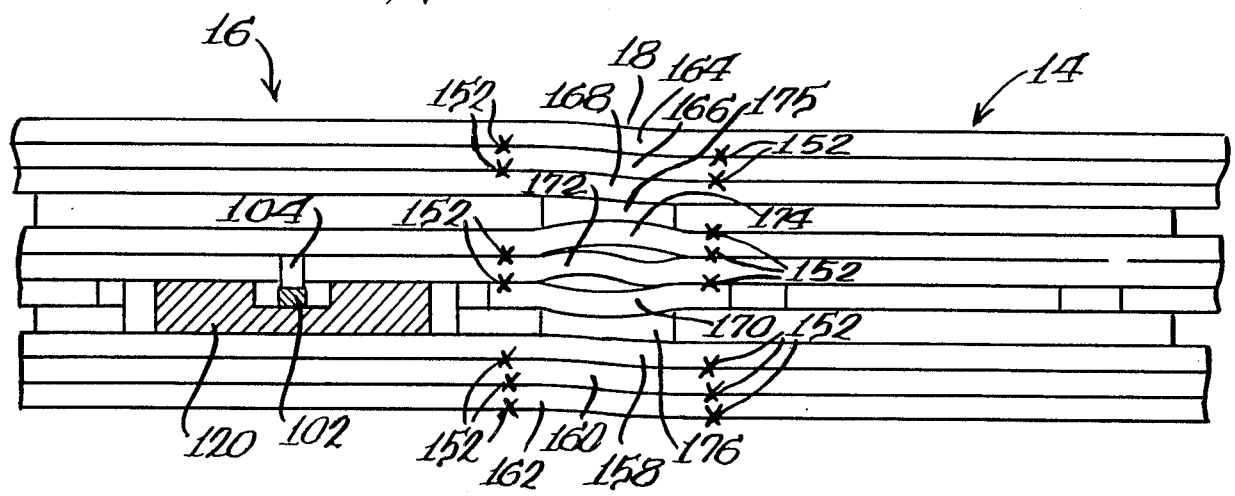
FIG. 3 is an enlarged, fragmentary sectional view taken approximately along the line 3—3 in FIG. 1.

An exemplary embodiment of an assembly made according to the invention is illustrated in the drawings and with reference to FIG. 1 is seen to include a housing, generally designated 10, which contains semiconductors and/or other electronic components as will be seen. The housing 10 as illustrated is formed of three housing sections 12, 14 and 16 in spaced, side by side relation. The housing sections 12, 14 and 16 are also generally parallel and are interconnected by integral, narrow, ribbon-like webs or tabs 18.

Some of all of the webs or tabs 18 are employed as bus bars integral with the housing sections to electrically interconnect various points of the differing housing sections 12, 14 and 16. This avoids the need for separate conductors or busses such as wires as well as avoids the need for fabricating connections as by soldering or brazing between conductors or busses and the elements forming the housing sections.

The housing sections further are made up of stacked, generally planar layers or sheets 20, some or all of which may form parts of two or more of the sections 12, 14 and 16. Cutouts 24 in the sheets 20 exteriorally of the housing sections 12, 14 and 16 are provided to save material. They also may define passages for heat exchange fluid, such as a gas, whereby such gas may be circulated about the exterior of the housing sections 12, 14 and 16 to carry away heat generated during operation of the assembly.

It should be recognized that while FIG. 1 shows three of the sections 12, 14 and 16, the invention contemplates that there be as few as two of the housing sections. The upper limit on the number of the housing sections is left to the designer.

Each of the housing sections 12, 14 and 16 will have one or more coolant ports 26 which may be interconnected to define a coolant flow path through the assembly such that a liquid coolant as, for example, oil, can be utilized to carry away heat generated within the housing operation of the electronic components contained therein.

Of particular consequence is the thickness of the layers or sheets 20. It is important that the same be thin enough so as to be readily deformable from their normal planar condition in the area of the webs or tabs 18. No absolute dimension can be given since the deformability will be a characteristic of the material of which the sheets are formed. And, as will be seen, the sheets 20 may be formed of dissimilar materials. In all cases, some of the sheets 20 will be formed of electrically conductive material which preferably is thermally conductive as well while others of the sheets 20 will be formed of an electrically insulating material which preferably will have a relatively high thermal conductivity. In some instances, the sheets or layers 20 may be formed of two or more thin sheets of like or dissimilar materials bonded together by any suitable means. Pressure bonding may be employed for the purpose and where the sheets are formed of metal, they may be brazed together. Pressure bonding may also be employed in bonding the layers together to meet requirements for electrical and/or thermal connections set in specification of the manufacturer of the electronic components used in the assembly.

The precise electrical configuration of electronic components contained within the housing 10 forms no part of the invention for that will differ depending upon the intended use of the assembly. However, each of the housing sections 12, 14 and 16 will house a stack of electronic components, most frequently semiconductor wafers, that is, semiconductors without their individual conventional housing and terminal packaging. Various ones of the sheets 20 that are electrically conductive serve to make the desired connections to the electrodes or terminals on the wafers and, electrical signals, inputs or outputs in one of the housing sections 12, 14 or 16 may be directed to electronic components in other of the housing sections via electrically conductive ones of the tabs or webs 18.

FIG. 2 illustrates, in exploded form, how electronic components may be arranged in a representative one of the housing sections, specifically, the housing section 14. It should be understood that FIG. 2 does not illustrate an entire stack for the length of a typical stack will be dependent upon the number of electronic components to be contained therein which in turn will depend upon the use to which the assembly is being put. With that understanding, the same will now be described. An uppermost one of the sheets is designated 40 and may be formed of insulating material. The same is provided with a central cutout 42 which may be utilized to position a semiconductor wafer or the like. The same also includes opposed openings 44 of a relatively large size. The holes 44 may receive O-rings seals such as shown at 46 elsewhere in FIG. 2 and form part of coolant manifolds for the housing section 14. Insulating tabs 48 corresponding to the webs 18 may or may not be provided on the insulating sheet 40. Where the sheet 40 is sandwiched by conductive sheets or layers, and the same have electrical connections to others of the housing sections via webs 18, the tabs 48 may be employed for electrical isolation.

Below the element 40 is a laminated element 50 which may be formed of two sheets 52 and 54 of electrically conductive and thermally conductive material. The use of two sheets 52 and 54 may be required to provide the necessary electrical capacity depending upon the useage to which the assembly is put. Alternately, the use of two or more sheets may be required to provide a desired thickness at a particular location in the stack.

Both sheets 52 and 54 are provided with holes 56 alignable with the holes 44 to provide a continuation of the coolant manifolds.

The sheets 52 and 54 may be brazed together except at locations 58 which correspond to the webs or tabs 18.

The next element in the assembly is designated 60 and may be composed of two conductive sheets 62 and 64. The sheets 62 and 64 may or may not have an interposed sheet of insulation, again depending upon the use to which the assembly is to be put. Both sheets 62 and 64 are provided with holes 66 alignable with the holes 44 and 56 to provide continuation of the coolant manifolds. Furthermore, the sheets 62 and 64 may each include a cutout 68 of tortuous configuration extending between the holes 66 thereby defining a coolant flow path between the manifolds.

Again, the sheets 62 and 64 may be brazed together when no insulation layer is disposed between the two except at location 70 corresponding to the webs or tabs 18. Brazing may also be employed to connect the sheets 62 and 64 to adjacent sheets in the stack such as the sheet 54 or a sheet below the sheet 64.

Both of the sheets 62 and 64, and the cutouts 68 therein, cooperate to define a generally diametrically extending finger 72. Centrally of the finger is an aperture 74 and the lower sheet 64 may include a linear cutout 76 which defines a conductor tunnel as will be seen.

The next element in the stack is designated 80 and is formed of two conductive sheets 82 and 84. The sheets 82 and 84 have holes 86 defining continuations of the coolant manifolds, a tortuous cutout 88 interconnecting the holes 86 to act as a coolant passage, and a diametrically extending finger 90 having a central aperture 92 corresponding to the aperture 74. In addition, the upper sheet 82 includes a linear cutout 96 which serves to cooperate with the cutout 76 to define a conductor tunnel.

An insulated, linear conductor 100 may be received in the cutouts 76 and 96 and terminates in a button or terminal 102 of conductive material which is disposed in the apertures 74 and 92. A resilient rubber plug 104 may be disposed in the aperture 74 above the button 102. As a consequence, the plug 104 will bear against the element 50 and, due to its resilience, bias the button 102 downwardly. Thus, the plug 104 serves as a biasing spring.

Immediately below the element 80 is an element 110 formed of conductive material. The element 110 is provided with opposed holes 112 which serve as continuations of the coolant manifolds and a central, enlarged aperture 114. The aperture 114 is sufficiently large that the button 102 may be disposed in the center thereof and be electrically isolated from the element 110.

In the stack below the element 110 is, for example, a semiconductor wafer 120. The same has, on its upper surface, a control electrode 122 aligned with the button 102 through the hole 114. Consequently, when the stack is assembled, the button 102 will make electrical contact with the electrode 122 so that an electrical signal applied to the conductor 100 will control the conductive state of the semiconductor 120.

Surrounding the electrode 122 is an electrode 124 which, it will be appreciated, will be in electrical contact with the element 110.

The underside of the wafer 120 defines a further electrode 126.

The wafer 120 is then received in an element 40 which, it will be recalled, is formed of insulating material. The thickness of the element 40 will correspond to the thickness of the wafer 120. Alternatively, several of the elements 40 sufficient to provide the requisite thickness may be utilized.

Underlying the element 40 is a further one of the elements 50 which, it will be appreciated, will be in electrical contact with the electrode 126 of the wafer 120.

Underlying the second element 50 may be an element 130 similar in construction to the element 60. It may differ, however, in that its diametrical finger 132 is aligned with a different one of its tabs 134. As can be seen in FIG. 2, in the case of the element 60, the finger 72, which provides a tunnel for the insulated conductor 100 is aligned with the leftmost tab 70 and thus would extend to the housing section 16 for electrical connection with some component therein. Conversely, in the case of the element 30, the finger 132 is aligned with the rightmost tab 134 and thus will provide a means of housing a similar insulated conductor which in turn would extend to the housing section 12 for connection to a component therein.

The element 130, of course, includes holes 136 defining continuations of the coolant conduit as well as a tortuous cutout 138 forming a coolant flow path.

Below the element 130 there may be disposed an element 140 which may be similar to the element 40 save for the fact that its central cutout 142 is of lesser diameter to receive a lesser diameter semiconductor wafer 150, which may be for example, a diode. From the foregoing, it will be appreciated that the elements 40, 60, 80, 110, 130 and 140, or slight variations thereof may be repeated throughout each of the housing sections 12, 14 and 16 as desired to house various types of semiconductor components. It will also be appreciated that other electronic components could be housed as well. Wafers of resistive material or disc-like capacitors can be located at desired points in each housing section utilizing the same principles.

Figure 4:
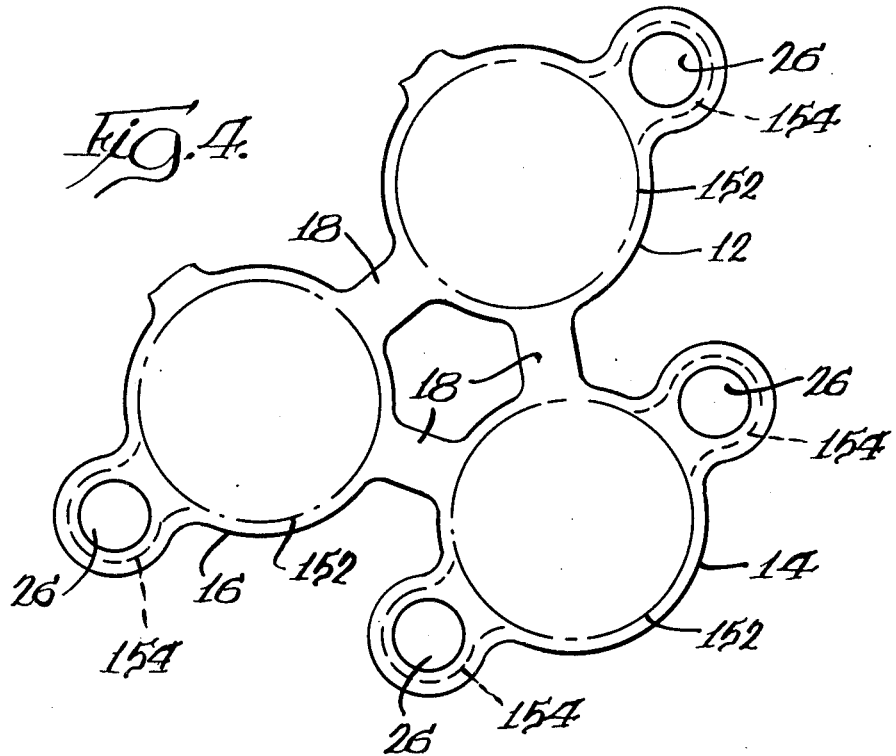
FIG. 4 is a fragmentary plan view of the assembly.

Turning now to FIGS. 3 and 4, an essential feature of the invention will be described. As alluded to previously, the various elements 40, 50, 60, 80, 110, 130 and 140 are held together by pressure bonding, brazing or the like at various locations and, the entire stack may be put into compression by conventional means (not shown) typically employed for the purpose. Bonding or brazing patterns are shown, for example, in FIG. 4. In particular, for sealing purposes, a continuous bond such as shown at 152 radially outwardly of the periphery of an electronic component may be provided. Bonding patterns such as shown at 154 may likewise be used about the holes in alignment with the ports 26 to avoid leakage thereat. Where bonds such as the bonds 154 are not employed, the O-ring seals 46 will likewise provide sealing.

Of considerable consequence is the fact that the webs or tabs 18 are devoid of any bonding. As a consequence, the tabs or webs 18 of each sheet will be deformable independently of the others. Because of the thinness of the sheets, very little effort is required to accomplish such deformation. Thus, as seen in FIG. 3, the tabs 18 extending between the housing sections 14 and 16 are free to bend to accommodate differences in the height or length of the stacks of electrical components contained within the housing sections 14 and 16. In particular, more or less uniform bending of three sheets is shown at 158, 160 and 162 in the area of the tabs 18 as well as at 164, 166 and 168.

In some cases, the tabs 18 will tend to crinkle and such is illustrated as, for example, at 170, 172 and 174. The phenomena of crinkling to achieve alignment and compensate for dimensional differences suggests that at least in certain of the sheets, there be an absence of tabs as shown, for example, at voids 175 and 176 to create a void into which the tabs can somewhat extend. As seen in FIG. 3, the bend in the tab shown at 174 extends into the void shown at 175 while the bend shown at 170 extends into the void shown at 176.

Generally speaking, it will be desirable to make the length of the tabs or webs 18 slightly greater than the desired spacing between the housing sections 12, 14 and 16 since such tabs can deform and crinkle as mentioned above in connection with the description of FIG. 3. If this is done, the tabs will always be placed in compression rather than in tension which has the advantage mentioned previously.

From the foregoing, it will be appreciated that an assembly of electronic components made according to the invention provides a number of advantages over prior art constructions in achieving compactness and simplicity. Moreover, multiple functions are combined into components in that, for example, the webs 18 not only provide a structural function, but may be selectively chosen to participate as part of the electronic circuit built into the housing to provide relatively high power conductive paths while eliminating the need for separate bus bars as well as fabricated connections associated therewith.

Dimensional differences in adjacent stacks, that is, in adjacent housing sections, are easily accommodated, whether such differences arise out of tolerance variations or the use of differing components having differing dimensions.

We claim:

1. An electrical assembly of semiconductors comprising:
   at least two stacks of semiconductors, said
   stacks being in spaced, but side by side,
   generally parallel relation; and
   a housing for said stacks; said housing being comprised of a series of stacked thin, generally planar layers of electrically and thermally conductive-and electrically insulating material encompassing said stacks, some said layers having cut outs to receive the semiconductors of said stacks and being bonded together about said cutouts, said layers further being unbonded in areas between said stacks so that said layers may individually deform in said areas to accommodate dimensional differences occurring between said stacks along the length thereof.

2. The assembly of claim 1 wherein said housing is comprised of plural sections, one for each stack, said sections being interconnected by narrow tabs integral therewith in at least some of said layers, said areas being defined by said tabs.

3. The assembly of claim 2 wherein at least some of said tabs are electrically conductive and define integral busses extending between said stacks.

4. The assembly of claim 2 wherein said layers in each said section have aligned openings defining at least one coolant manifold radially outwardly of said cutouts in the associated section, and some of said layers have a cooling path cutout extending to the opening in the corresponding layer.

5. The assembly of claim 4 wherein said cooling path cutouts are tortuous.

6. The assembly of claim 1 wherein some of said layers comprise laminated sheets of dissimilar ones of said materials.

7. An electrical assembly of semiconductors comprising:
   at least two stacks of semiconductor wafers in spaced, parallel relation;
   a plurality of housing sections, one for each said stack and each comprised of stacked thin sheets of electrically conductive and electrically insulating material in predetermined relation, at least some of said sheets having cutouts shaped to receive a predetermined one of the semiconductor wafers in the associated stack;
   means holding said sheets together such that each said section houses the semiconductors of the associated stack; and
   ribbon-like, flexible tabs integral with at least some of said sheets and interconnecting said housing sections, said tabs being deformable generally independently of the others of the tabs to accommodate dimensional differences between said stacks along the length thereof.

8. The assembly of claim 7 wherein at least some of said sheets are bonded together except at said tabs.

9. The assembly of claim 8 wherein the length of said tabs is slightly greater than the desired spacing between said housing sections.

10. The assembly of claim 7 wherein said tabs are electrically conductive to provide busses extending between said housing sections.

* * * * *